United States Patent [19]
Edwards et al.

[11] 3,992,666
[45] Nov. 16, 1976

[54] TECHNIQUE FOR DETECTING ENERGY AND DETERMINING THE FREQUENCY OF CONSTITUENT ENERGY COMPONENTS

[75] Inventors: James H. Edwards, Alexandria, Va.; Robert M. Mason, Temple Hills, Md.

[73] Assignee: The United States of America as represented by the Secretary of the Navy, Washington, D.C.

[22] Filed: Jan. 27, 1975

[21] Appl. No.: 544,464

[52] U.S. Cl. .................... 324/77 R; 324/77 G; 324/77 B; 324/78 F
[51] Int. Cl.² ............................................. G01R 23/16
[58] Field of Search ............ 324/77 R, 77 G, 77 B, 324/78 F; 328/134, 141; 307/233; 343/55 A

[56] References Cited
UNITED STATES PATENTS

| 3,157,781 | 11/1964 | Gruen | 324/77 G |
| 3,564,424 | 2/1971 | Freeman | 324/77 R |
| 3,634,760 | 1/1972 | Murtin | 324/77 R |
| 3,638,037 | 1/1972 | McMurtrie | 324/78 F |
| 3,715,509 | 2/1973 | Dawson | 324/77 B |

*Primary Examiner*—Palmer C. Demeo
*Assistant Examiner*—Michael J. Tokar
*Attorney, Agent, or Firm*—R. S. Sciascia; Philip Schneider; Norman Brown

[57] ABSTRACT

Frequency and other characteristics of energy contained in a region of the electromagnetic or acoustic spectrum under examination is determined by subdividing the region, examining each subdivision for energy content, and then further subdividing and examining those subdivisions exceeding a threshold energy. This process is continued until the bandwidth of the last subdivision is equal to the desired frequency resolution.

6 Claims, 2 Drawing Figures

3,992,666

TECHNIQUE FOR DETECTING ENERGY AND DETERMINING THE FREQUENCY OF CONSTITUENT ENERGY COMPONENTS

BACKGROUND OF THE INVENTION

The present invention relates to a means for accurately detecting and measuring characteristics of signals, and more particularly to rapidly detecting and determining the frequency and other characteristics of signals.

Because of the growing use of the electromagnetic and acoustic spectra in military and civilian application, and in light of the increasing sophistication of modern electronic systems, the need to quickly, economically, and accurately detect and measure characteristics of these signals is becoming increasingly important. It is often necessary to monitor portions of the electromagnetic or acoustic spectra in order to detect sources of energy radiation and determine various characteristics of the radiated energy.

The military especially needs to be able to observe subtle changes in spectral usage that might warn of an impending attack or violations of international laws and agreements. Military ships and aircraft frequently depend for their survival on various types of electronic threat-warning devices. Timely threat-warning is essential in modern warfare in order to locate and attack the enemy, take evasive action, employ countermeasures, or use some combination of these.

Receiving systems currently in use for detection and analysis of signals generally are of one of three types; fixed tuned, manually tuned or automatically tuned. In general, each have for the purpose at hand, inadequate reaction time or poor sensitivity, or both.

Fixed-tuned surveillance receivers generally have very poor frequency resolution because of necessary utilization of wide-band filters in order to cover the frequency range of interest. Conventional tunable surveillance receivers generally "step" or sequence through discrete frequency increments or "channels." These channels are generally of small frequency range with respect to the frequency range of the overall band of the electromagnetic spectrum being examined for signals. The result of the receiver stepping through small frequency increments "listening" for a signal in each increment is that a significant portion of its time is spent tuned to inactive frequencies. Thus there is inherent in a tunable system of this type a large probability of missing signals that are active only briefly, because of the lack of coincidence between the signal frequency and the tuned receiver frequency.

The present invention is based on an application of principles of information theory and results in a system that offers high sensitivity, short response time, and a relatively small number of components. This combination of features allows an important improvement over conventional techniques, and offers a means of overcoming the significant deficiencies inherent in the conventional surveillance receivers described above. Further the invention provides a means for tailoring the performance of the surveillance receiver to the particular application and environment in which it is operating. Importantly then, this invention has the capability of adapting itself, to some extent, to either a static or a dynamic environment.

The present invention is particularly concerned with "monitoring" the greatest number of "channels" in the shortest period of time with a relatively small number of components, while at the same time minimizing signal attenuation and distortion. Clearly there are designs other than that of the present invention which will monitor a greater number of channels in less time, but these designs involve a large number of components or include other undesirable aspects. For example, a design including multiple local-oscillators and a series of corresponding filters of decreasing bandwidth, each of whose output is detected, requires many more components than does the present invention. Further, it introduces undesirable attenuation and distortion, and is not readily usable to obtain information other than the frequency of the monitored signal.

Another design where overlapping of the bands is utilized for resolving the frequency of the monitored signal utilizes equal bandwidth filters, each of a different center frequency. This arrangement also requires more filters than does the present invention. More importantly, this device, too, is not usable to obtain information relating to characteristics of the monitored signal—other than its frequency.

SUMMARY OF THE INVENTION

The present invention examines a region of interest of the electromagnetic or acoustic spectrum in order to detect energy within the region and to determine the frequency, to a desired bandwidth resolution, of components of this energy. A method is utilized wherein the region is initially divided into a group of first-level subregions. Energy content of each first-level subregion is then determined and existence of energy within each subregion is noted. Each subregion containing a threshold energy is then further subdivided to form a group of smaller second-level subregions, and energy content of each of these second-level subregions is noted. Any second-level subregion containing a threshold energy is itself further divided to form a group of third-level subregions for examination. This procedure is continued, forming nested sub-levels, until the frequency-bandwidth of the last-level subdivision is equal to the frequency resolution desired in the particular area of the region of interest.

It is therefore an object of the present invention to rapidly detect the presence and the frequency of energy.

It is a further object of the present invention to detect the presence and the frequency of energy through a method of dividing the region of interest into nested subregions for examination.

Further objects, advantages and novel features of the invention will become apparent from the following detailed description of the invention when considered in conjunction with the accompanying drawings wherein:

DETAILED DESCRIPTION OF THE INVENTION

Figure 1:
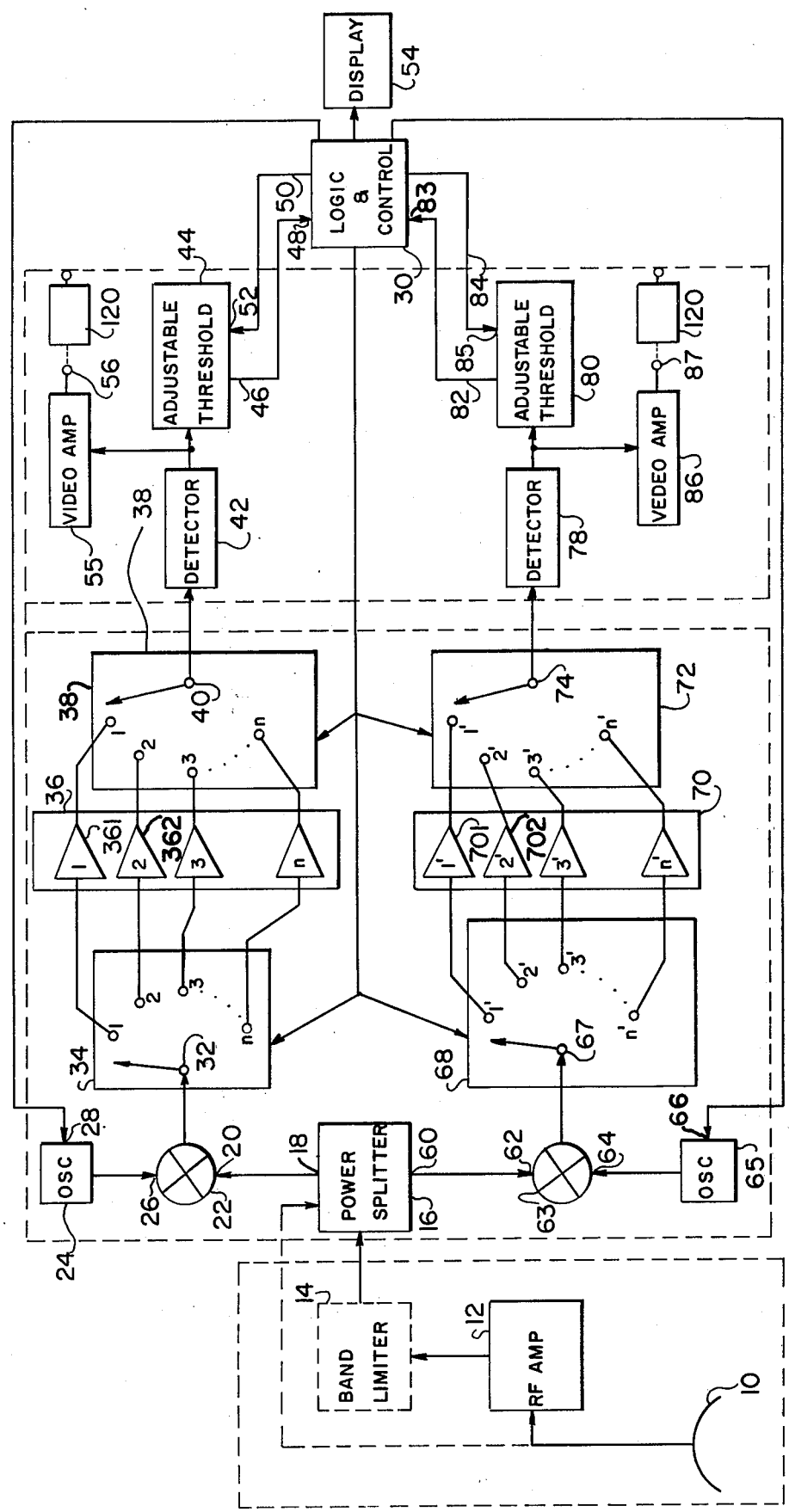
FIG. 1 is a functional schematic block diagram of an embodiment of the present invention.

Referring now to FIG. 1, the output of an antenna 10 is coupled to the input of a radio-frequency amplifier 12 which in turn is connected through a preselector (i.e., band limiting) device 14 to a power splitter 16. A first output terminal 18 of power splitter 16 is connected to a first input terminal 20 of a first sum-difference mixing device 22. The output from a first local oscillator 24 is connected to a second input terminal 26 of mixing device 22. First local oscillator 24 has a control terminal 28 connected to an output terminal of a digital logic and control device 30. The output of first mixer device 22 is connected to a center-terminal 32 of an n-position switching device 34. In the embodiment of the present invention, n is equal to 6. For purposes of discussion each switch-position terminal (other than the center terminal 32) is sequentially numbered 1 through n. Each output terminal (1 through n ) of switching device 34 is respectively connected to a corresponding input terminal of a correspondingly numbered amplifier of a first set of band-limiting amplifiers 36. The output terminal of each of the bandlimiting amplifiers of set 36 is respectively connected to a correspondingly numbered terminal of a second n-position switching device 38, having a center-terminal 40.

Center terminal 40 is connected to the input terminal of a first detection device 42, whose output terminal is coupled to the input of a first adjustable-threshold device 44. A data-line 46 is connected from the output terminal of adjustable-threshold device 44 to an input-terminal 48 of digital logic and control device 30. A control-line 50 is connected from an output terminal of digital logic and control device 30 to a control-terminal 52 of adjustable-threshold device 44. A display device 54 is connected to another output-terminal of digital logic and control device 30.

An optional video amplifier 55 has an output terminal 56, and an input terminal coupled to the output terminal of detector device 42.

Circuitry essentially identical to a portion of the above described circuit is connected to power splitter 16 in a fashion identical to that just described. More particularly, a second output-terminal 60 of power splitter 16 is connected to a first input-terminal 62 of a second sum-difference mixer 63. A second mixer input-terminal 64 is connected to the output terminal of a second local-oscillator 65. Oscillator 65 also has a control terminal 66 connected to an output terminal of digital logic and control device 30.

The output terminal of second mixer device 63 is connected to the center-terminal 67 of a third n-position switching device 68. For purposes of discussion, each switch-position terminal (other than the center terminal 66) is sequentially numbered 1' through n' (where n' is equal to n). Each output terminal (1' through n') of switching device 68 is respectively connected to a corresponding input terminal of a correspondingly numbered amplifier of a second set of band-limiting amplifiers 70. These band-limiting amplifiers 70 are designed so that correspondingly numbered amplifiers from first and second amplifier sets respectively are of virtually identical design and performance.

The output terminal of each of the band-limiting amplifiers of the second set 70 of band limiting amplifiers is respectively connected to a corresponding input terminal of a fourth n-position switching device 72. Fourth switching device 72 has a center-terminal 74 connected to a detecting device 78 whose output is in turn connected to a second adjustable-threshold device 80. Adjustable threshold device 80 has a data-line 82 connected to an input terminal 83 of digital logic and control device 30. A control-line 84 is connected from an output-terminal of digital logic device 30 to a control terminal 85 of adjustable threshold device 80.

An optional video amplifier 86 has an output terminal 87, and an input terminal coupled to the output of detecting device 78.

A pulse train deinterleaver 120, may optionally be conected to the output terminal of each video amplifier 55, 86.

Each switch means 34, 38, 68, 72 has a control terminal connected to an output terminal of logic and control device 30. The switch means may be in the form of electronic switches or equivalent devices such as electrically controlled relays.

Although many equivalent devices may be utilized in performing the functions accomplished by the present invention, the following arrangements, for example, are utilized in the present embodiment of the invention:

The combination of first local oscillator 24 and first mixer device 22, utilized in combination with logic and control device 30, forms a first frequency shifting means. A first adjustable bandwidth detection means is formed by the combination of first switching device 34, first set of amplifiers 36, and second switching device 38 utilized in cooperation with logic and control device 30. Detector 42 and adjustable threshold device 44 form a first signal examining means.

Second local oscillator 65 and second mixer device 63 utilized in combination with logic and control device 30 form a second frequency shifting means, while the combination of third switching device 68, second set of amplifiers 70, and fourth switching device 72 utilized in cooperation with logic and control device 30, form a second adjustable bandwidth detection means. Detector 78 and threshold adjustable threshold 80 form a second signal examining means. The combination of frequency shifting means and adjustable bandwidth means forms an adjustable-frequency, adjustable bandwidth processing means.

In this embodiment of the present invention, the antenna 10 is of appropriate design and construction so as to collect energy in the frequency region of concern, which is then amplified by amplifier 12. Preselector 14 may be employed to limit the frequencies of the band or region of energy examined.

In some instances it may be desirable to omit amplifier 12 and band limiter 14, connecting antenna 10 directly to the power-splitter 16, as indicated by the dashed line in FIG. 1. Also, it may be desirable to utilize a circulator (or similar device) in conjunction with power splitter 16 to prevent signals from the local oscillators 24, 65 from leaking into the wrong mixer. For example, image rejection mixers could be used as a means of minimizing undesirable signal leakage. Another method for coping with induced images could involve shifting the local oscillator frequency and processing the resultant output to reject the unwanted sideband.

Figure 2:
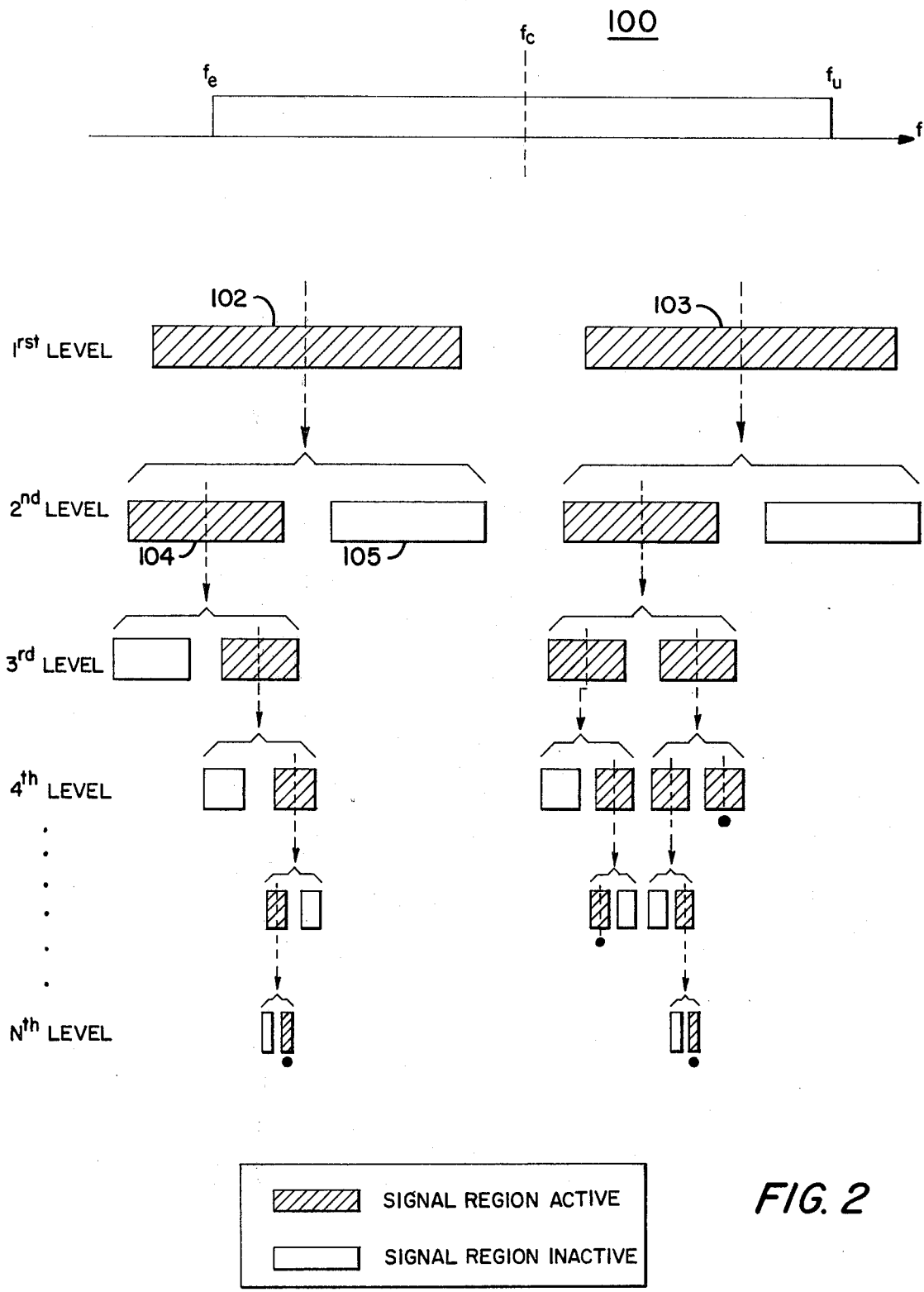
FIG. 2 is an illustration of division of the region of interest (of the electromagnetic spectrum) into subregions in accordance with the method of the present invention.

The method of the present invention for isolating particular energy components will be readily understood by examination of FIG. 2. A frequency region 100 to be examined which extends from a lower frequency $f_e$ to an upper frequency $f_u$, is depicted along the frequency axis $f$. A frequency $f_c$ is indicated at the midpoint of the frequency range $f_e$-$f_u$.

In accordance with the method and overall operation of the present invention, an antenna or appropriate energy extraction device samples the energy content of the entire region 100. The region 100 is divided into a pair of first-level subregions 102, 103. Both subregions are simultaneously examined by a pair of examining means (i.e., detector and threshold devices). Each firstlevel subregion found to contain energy exceediing a predetermined threshold (indicated as "signal region active") is noted by logic and control device 30, and further subdivision and examination made of it.

Further examination of a subdivision can proceed in either of two ways, or in combination. In the preferred embodiment all subdivisions of a given level are examined and threshold energy content therein noted before examination proceeds to the next level of subdivision. This procedure entails analyzing the first-level subdivisions and proceeding to form second-level subdivisions by dividing all first-level subdivisions containing a threshold energy (indicated as "signal region active") while ignoring for further analysis those subregions not having a threshold energy (indicated as "signal region inactive"). Then all second-level subdivisions would be similarly analyzed and subdivided to form third level subdivisions. This process is continued until each subdivision containing a signal has a bandwidth sufficiently narrow to isolate the signal to a desired frequency resolution at a particular frequency (indicated by a dot below the particular subdivision in FIG. 2). This "variable resolution" procedure provides an efficient way to process each signal frequency to only the frequency resolution desired for each particular frequency.

In some instances, where perhaps particular frequencies are of special interest, examination may proceed through to higher order subdivisions (those encompassing the frequencies of special concern) before examining remaining lower-level subdivisions (for example, the dotted path of FIG. 2).

In the present embodiment of the invention, a region of interest is chosen in the electromagnetic spectrum between 8 GHz and 10 GHz. The bandwidth, R, of the region is thus 2 GHz. The center frequency of this region is obviously 9 GHz, which divides the region into a pair of first level subregions comprising a first subdivided region 102 (8 – 9 GHz) and a second subdivided region 103 (9–10 GHz), having respective center frequencies of 8.5 GHz and 9.5 GHz.

Electromagnetic energy is collected by antenna 10, amplified and limited respectively by amplifier 12 and band-limiter 14, and is divided into equal-energy components by power splitter 16. The two equal-energy components from power splitter 16 are applied at input terminals 20, 62 of respective first and second sum-difference devices 22, 63. First and second local oscillators 24, 65 each generate an output signal whose frequency is independently controllable by control signals from logic and control device 30 applied at respective oscillator control terminals 28, 66. The frequency of each local oscillator 24, 65 in effect determines the center frequency of the subregion to be examined by its corresponding signal detection means.

The output signal from each of first and second local oscillators 24, 65 is applied to a corresponding second terminal 26, 64 of respective first and second sum-difference devices 22, 63. Each of the sum-difference devices 22, 63 generates an output signal which contains two signal components, one component having a frequency equal to the sum of the signal frequencies applied at each of its two input terminals, and the other component having a frequency equal to their difference.

To implement the method of the present invention, logic and control device 30 sets the frequency of first and second local oscillators 24, 65 so that either the sum or difference between its frequency and the center frequency of the particular subdivision to be examined is equal to the design frequency of the appropirate one of subdivision-level amplifiers 36, 70.

Switching of all four switch means is also controlled by logic and control means 30 to establish connection of the appropriate level amplifier for the level of subdivision to be examined. In other words, the frequencies of first and second local oscillators 24, 65 are chosen so that each amplifier selected by switch means 34, 68 to receive the mixed output signal (from mixers 22, 63) will receive a signal appropriate in frequency to the design of that amplifier (i.e., the shifted subregion center frequency).

Thus for the present example, first and second local oscillators 24, 65 are set respectively to frequencies of 7.5 GHz and 6.5 GHz by signal from logic and control device 30. The 7.5 GHz signal from first oscillator 24 is mixed in first mixer 22 with the signal from the first output terminal 18 of power splitter 16, while the 6.5 GHz signal from second oscillator 65 is mixed in second mixer 63 with the second output terminal 60 of power splitter 16. This results in a difference signal from output terminal 23 of first sum-difference mixer device 22 having energy frequency components potentially from 1.5 GHz to 2.5 GHz (i.e., a 1 GHz range centered at 2 GHz). Similarily, the difference signal from second mixer 63 thus has energy frequency components potentially between 1.5 GHz and 2.5 GHz (i.e., a 1 GHz range centered at 1 GHz).

In operation, logic and control device 30 first causes all four switch means 34, 38, 68, 72 to be set to position No. 1, connecting the respective output of first and second mixer devices 22, 63 through the first amplifier 361, 701 of each of first and second band-limiting amplifier sets 36, 70 to corresponding first and second detectors 42, 78 (i.e., for processing the first-level subregion pair 102, 103).

Received energy contained in first-level subdivisions 102, 103 are amplified by the band-limiting amplifiers 361, 701.

In the embodiment of the present invention, the bandwidth of the first amplifier 361, 701 of each amplifier set 36, 70 is selected equal to $1/n_k$ times the region bandwidth, R, (where $n_k$ represents a positive integer). In the present embodiment, the value of $n_k$ is chosen equal to two. Thus in the present embodiment, the first pair of amplifiers 361, 701 are each designed to amplify half the band of interest, and therefore they are each designed to have a bandwidth of 1 GHz. The center frequency of all amplifiers 36, 70 is determined by the frequency necessary for optimum amplifier performance. The design center-frequency of each of these first two amplifiers 361, 701 is chosen to be 2 GHz.

All amplifiers 36, 70 utilized in the embodiment of the present invention are of the intermediate frequency (IF) type, and are designed in pairs with corresponding amplifiers of respective sets 36, 70 having virtually identical gain and bandwidth characteristics.

The bandwidth of the second amplifier 362, 702 of each amplifier set 36, 70 is selected equal to $R_2/n_k$, and the $k^{th}$ level amplifier of each amplifier set 36, 70 is designed to have a bandwidth of $R_k/n_k$.

Each $k^{th}$ level of subdivision is analyzed by the correspondingly numbered amplifier from the appropriate first and second amplifier set 36, 70. For example, the "number two" amplifiers 362, 702 constituting the second pair each have a center frequency of 1 GHz, and a bandwidth of 0.5 GHz.

Continuing with the example, to analyze the first pair 104 (8 GHz – 8.5 GHz), and 105 (8.5 GHz – 9 GHz) of second-level subdivisions, all switch means 34, 38, 68, 72 are set to the second switch position. First local oscillator 24 is set to 7.25 GHz, while second local oscillator 65 is set to 7.75 GHz. This produces respective difference frequency components (from corresponding sum-difference mixer devices 22, 63) centered at 1 GHz (i.e., the subregion 104, 105 center-frequencies shifted appropriately for amplification by second amplifier pair 362, 702). Detector means 42, 78 then each produce an output signal indicative of the energy content in the subregion frequency range as amplified by its corresponding band-limiting amplifier 362, 702. The detector output signal is applied to respective adjustable threshold devices 44, 80 where the output signal level is compared with thresholds representing a threshold level set to a value computed by or stored in digital logic device 30. By this technique a different threshold may be used for different frequencies and different subdivision levels, and may be varied to accommodate different applications. An above-or-below threshold signal is then generated by each corresponding threshold device 44, 80.

Logic and control device 30 examines each threshold device output signal and notes the indication of a threshold energy in the subdivision under examination. Switching commands are then generated by the control portion of digital logic and control device 30. These commands, or control signals, cause all four switching means 34, 38, 68, and 72 to advance to the next (e.g., third) level position and cause the amplification-detection-threshold determination notation analysis-process to be repeated. This process is continued until the desired signal resolution is achieved for all energy components having at least a predetermined threshold energy in the region.

It should be noted that the signal amplitudes in one subregion generally are not compared with those in another, but are used instead to trigger a threshold circuit that indicates subregion activity. In this manner, the process avoids a potential problem of being biased toward the strongest signal.

An important aspect of the present invention is the ability to have the "raw video" monitored signal available. The output terminal 56, 87 of corresponding video amplifiers 55, 86 provides this source of video signal. The video signal can be utilized in further analysis of the monitored signal. A pulse train deinterleaver 120 may, for example, be connected to each video amplifier output terminal 56, 87 in order to separate interleaved pulse trains, thus allowing display or computer analysis of one signal.

The embodiment of the present invention is intended to be simply an illustration of one possible implementation of the basic concept, which may be applied in any number of variations. Also, the method of the present invention as heretofore described may be extended. The search algorithm may be described in mathematical form using multiple base arithmetic, or base $n_k$, where $n_k$ is the radix assigned to the $k^{th}$ level of subdivision. More commonly $n_k$ will be a constant and the number base will be $n$-ary. Advantages with regard to optimizing signal monitoring will accrue if $n_k$ is chosen equal to two, which yields the binary system — the system chosen for the embodiment of the present invention. Also, receiver characteristics such as instantaneous bandwidth, dynamic range, dwell times, and frequency coverage can be selected to optimize the system design and performance of the receiver for a particular application.

Of course, conventional electronic design appropriate to the operating frequency of a given stage of the embodiment of the present invention is utilized. For example, when processing radio frequency energy from antenna 10 the amplifier 12 and preselector 14 may employ crystal video, instantaneous frequency monitoring (IFM), superheterodyne techniques, or some equivalent or combination thereof. At acoustic frequencies, other appropriate techniques would obviously be employed.

An obvious way of saving hardware at the expense of system reaction time is to remove the power splitter and to multiplex one local oscillator, mixer, and amplifier section rather than to use two identical sections as described. Then by simply shifting the frequency of a single local oscillator it would be possible to cover both halves of a given band in sequence, resulting in some improvement in sensitivity due to the decreased switching attenuation and the elimination of losses associated with power splitter 16. Another alternative could use a separate detector and threshold circuit in each of the $n_k$ detection channels. One advantage of this approach is that the detector and threshold circuits could be matched to the specific frequency bands of the channel of which they are installed.

It should be noted that the logic and control function of the present embodiment simply sets the frequency of first and second oscillators 24, 65, the positions of switch means 34, 38, 68, 72 and adjusts the threshold of adjustable threshold devices 44, 80 all in accordance with the above description of the technique of the present invention. It of course also keeps track of the subregions to be examined and the frequency content of each desired threshold levels and bandwidth resolutions, as well as noting (as through display device 54) the frequency, bandwidth and related information. Obviously these functions could well be performed by hand or by resort to general or special purpose digital computer systems (such as are found in computer controlled electronic systems).

In some cases it may be advantageous to combine the present invention with more conventional approaches. For example, a hybrid configuration might consist of an instantaneous frequency monitoring (IFM) stage for the initial cueing information followed by the design of the present invention for finding frequency resolution.

Obviously many modifications and variations of the present invention are possible in light of the above teachings. It is therefore to be understood that within the scope of the appended claims the invention may be practiced otherwise than as specifically described.

What is claimed and desired to be secured by Letters Patent of the United States is:

1. A method for detecting energy within a frequency region and for determining the frequency, to a desired bandwidth-resolution, of components of said energy comprising the steps of:

first, extracting a sample of energy representative of the energy content of the entire of said region;

second, dividing said sample into contiguous subregions which, together, cover the region of the sample;

third, examining each said subregion for the presence of a predetermined threshold energy contained therein;

fourth, subdividing as before each subdivision having a bandwidth greater than said desired bandwidth resolution and containing at least a predetermined threshold energy;

fifth, examining each further subdivided subregion for the presence of at least a predetermined threshold energy; and sixth, repeating the fourth and fifth steps until the frequency of all of said energy components exceeding a desired energy threshold has been determined to within said desired bandwidth resolution.

2. A method for detecting energy within a frequency region and for determining the frequency, to a desired bandwidth-resolution, of components of said energy comprising the steps of:

first, extracting a sample of energy representative of the energy content of the entire of said region;

second, dividing said sample into a number $n_k$ of $k^{th}$ level frequency subregions, and initially letting $k$ equal to one;

third, examining each of said $n_k$ $k^{th}$-level subregions for the presence of a predetermined threshold energy contained therein;

fourth, subdividing each of said $n_k$ $k^{th}$-level subregions whose frequency-bandwidth is greater than said desired bandwidth-resolution of said energy components being examined but which also has an energy content exceeding said predetermined energy threshold into $n_p$ $p$-level frequency subregions, where $p = k + 1$;

fifth, incrementing $k$ by one; and sixth, repeating the third, fourth, and fifth steps until the frequency of all of said energy components exceeding a desired energy threshold has been determined to within said desired bandwidth-resolution.

3. The method of detecting and determining frequency of energy of claim 2 wherein $n_k$ is equal to two for all values of $k$.

4. Apparatus for detecting energy within a frequency region and for determining frequency, to a desired bandwidth-resolution, of components of said energy comprising:

means for extracting a sample of energy representative of the energy content of the entire of said region;

first adjustable-frequency, adjustable-bandwidth processing means coupled to said extracting means for subdividing said region into a series of contiguous subregions which, together, cover the region of the sample;

first means coupled to said subdivision means for examining each said subregion for the presence of a predetermined threshold energy contained therein;

second adjustable-frequency, adjustable-bandwidth processing means for subdividing, as before, each said subdivision having a bandwidth greater than said desired bandwidth resolution and containing at least a predetermined threshold energy, until each said energy component exceeding a predetermined threshold is resolved in frequency to within said desired bandwidth; and second means for examining each further divided subdivision having a bandwidth greater than said desired bandwidth resolution and containing at least a predetermined threshold energy, until each said energy component exceeding a predetermined threshold is resolved in frequency to within said desired bandwidth.

5. The detection apparatus of claim 4 wherein said adjustable-frequency, adjustable-bandwith processing means comprises:

energy division means coupled to said energy extracting means for dividing said energy sample into equal energy components at respective output terminals;

adjustable-bandwidth means for selectively passing a predetermined bandwidth of frequency;

frequency shifting means coupled between said energy division means output terminals and said adjustable bandwidth means for shifting the frequency of each of said equal energy components to a frequency appropriate to said adjustable bandwidth means; and cooperating logic and control means for causing subdivision.

6. The detection apparatus of claim 4 wherein each said examining means comprise an energy detection means, a threshold detection means coupled to the output of said energy detection means, and cooperating logic and control means coupled to said threshold detection means for adjusting a detection threshold.

* * * * *